(12) United States Patent
Ostermayr et al.

(10) Patent No.: US 8,846,462 B2
(45) Date of Patent: Sep. 30, 2014

(54) TRANSISTOR LEVEL ROUTING

(75) Inventors: Martin Ostermayr, Beacon, NY (US);
Chandrasekhar Sarma, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 517 days.

(21) Appl. No.: 13/283,698

(22) Filed: Oct. 28, 2011

(65) Prior Publication Data

US 2012/0083108 A1 Apr. 5, 2012

Related U.S. Application Data

(62) Division of application No. 12/481,183, filed on Jun. 9, 2009, now Pat. No. 8,076,730.

(51) Int. Cl.
*H01L 21/00* (2006.01)
*H01L 29/78* (2006.01)
*H01L 27/02* (2006.01)
*H01L 27/118* (2006.01)
*H01L 29/66* (2006.01)

(52) U.S. Cl.
CPC ......... *H01L 29/7833* (2013.01); *H01L 27/0207* (2013.01); *H01L 27/11807* (2013.01); *H01L 29/6659* (2013.01)
USPC ........... 438/154; 438/199; 438/785; 257/365; 257/204; 257/E21.625

(58) Field of Classification Search
USPC .......... 438/154, 199, 785; 257/204, 365, 508, 257/E21.625
See application file for complete search history.

(56) References Cited

U.S. PATENT DOCUMENTS

| | | | |
|---|---|---|---|
| 5,441,916 A | 8/1995 | Motonami | |
| 5,635,426 A | 6/1997 | Hayashi et al. | |
| 5,979,784 A | 11/1999 | Liang et al. | |
| 6,531,730 B2 | 3/2003 | Sandhu et al. | |
| 6,858,934 B2 | 2/2005 | Tang et al. | |
| 2006/0237796 A1 | 10/2006 | Cartier et al. | |
| 2007/0228480 A1 | 10/2007 | Yen et al. | |
| 2007/0267674 A1 | 11/2007 | Lin et al. | |
| 2009/0108372 A1 | 4/2009 | Chen et al. | |
| 2010/0025746 A1 | 2/2010 | Chapman et al. | |
| 2010/0184260 A1 | 7/2010 | Luo et al. | |

*Primary Examiner* — David Vu
(74) *Attorney, Agent, or Firm* — Slater & Matsil, L.L.P.

(57) ABSTRACT

A system and a method for transistor level routing are disclosed. The method comprises forming a high-k dielectric layer over a substrate, forming a metal layer directly over the high-k dielectric layer, and selectively disposing a semiconductive layer over the metal layer. The method further comprises forming a first transistor in a first region and a second transistor in a second region spaced from the first region, the first and second transistor having gate stacks comprising a high-k dielectric layer, a metal layer and a semiconductive layer, and forming an electrical connection between the first transistor and the second transistor comprising the high-k dielectric layer and the metal layer but not the semiconductive layer.

20 Claims, 4 Drawing Sheets

TRANSISTOR LEVEL ROUTING

This is a divisional application of U.S. patent application Ser. No. 12/481,183, entitled "Transistor Level Routing," which was filed on Aug. 18, 2010, and which is hereby incorporated herein by reference.

TECHNICAL FIELD

The present invention relates generally to a system and method for transistor level routing using metal.

BACKGROUND

Front-end processing or front end of line (FEOL) refers to the formation of semiconductor devices, such as transistors or capacitors, on or within a semiconductor substrate. The semiconductor devices are manufactured by depositing films, patterning these films and etching them in order to create the desired semiconductor device. Other steps may be additionally used such as annealing, doping, cleaning or polishing, for example.

Once the various semiconductor devices have been created they must be interconnected to form the desired electrical circuits. The back end of line (BEOL) involves creating conductive interconnecting wires that are isolated by insulating dielectrics. The insulating material was traditionally a form of $SiO_2$ or a silicate glass but recent changes in technology requires new materials with a low dielectric constant (low-k). These new dielectric materials include SiOC, for example, and have dielectric constants of around 2.7 (compared to 3.9 for $SiO_2$), although materials with constants as low as 2.5 or even lower (ultra low-k) are currently being used.

Historically, only a few level of interconnect layers have been necessary to electrically integrate the semiconductor devices. The interconnect layers have been isolated by insulating material and connected by connections called vias. Aluminum was the preferred material. Aluminum is still used in some applications today.

More recently, as the number of interconnect levels for logic devices has substantially increased due to the large number of semiconductor devices that are now interconnected in a modern integrated circuits the timing delay in the wiring has become significant prompting a change in wiring material from aluminum to copper and from the silicon dioxides to the new low-k/ultra low-k materials. This performance enhancement also comes at a reduced cost via damascene processing that eliminates processing steps.

Modern integrated circuit manufacturing technology uses a process called damascene processing. A damascene process deposits the dielectric material first as a blanket film, and is patterned and etched leaving holes or trenches. In "single damascene" processing, copper is then deposited in the holes or trenches surrounded by a thin barrier film resulting in filled vias or wire "lines" respectively. In "dual damascene" technology, both the trench and via are fabricated before the deposition of copper resulting in formation of both the via and line simultaneously, further reducing the number of processing steps.

SUMMARY OF THE INVENTION

These and other problems are generally solved or circumvented, and technical advantages are generally achieved, by preferred embodiments of the present invention which provide a novel system of transistor level routing and a method of manufacture thereof.

In accordance with a preferred embodiment of the present invention, a semiconductor device including a first semiconductor device formed on a first active area in a substrate, the first semiconductor device having a first gate stack comprising a first high-k dielectric layer, a first metal layer and a first poly-silicon layer. The semiconductor device further includes a second semiconductor device formed on a second active area in the substrate, the second semiconductor device having a second gate stack comprising a second high-k dielectric layer, a second metal layer and a second poly-silicon layer. An electrical connection connects the first semiconductor device with the second semiconductor device and overlies the first active area, the second active area and a portion of the substrate between the first active area and the second active area. The electrical connection includes a high-k dielectric layer and a metal layer but not a poly-silicon layer and the metal layer is arranged directly over the high-k dielectric layer.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
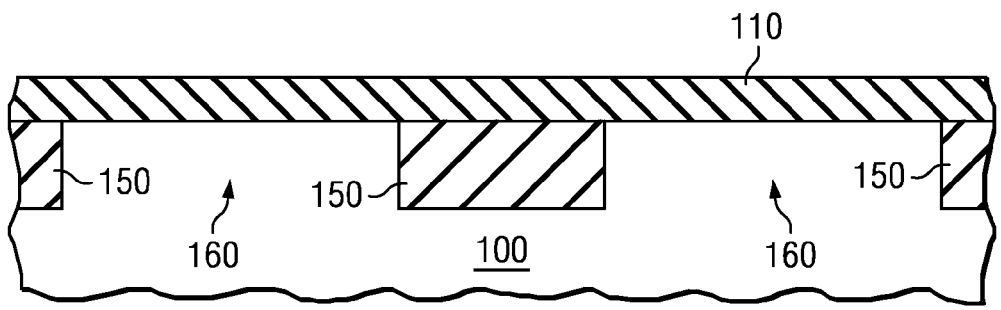
FIG. 1 shows a cross sectional view of a dielectric layer on top of a substrate.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a transistor level routing comprising a metal to electrically connect semiconductor devices. The invention may also be applied, however, to transistor level routing comprising a metal to electrically connect some semiconductor devices while others are connected using routing comprising a semiconductive material.

The material of choice for transistor level routing or transistor level wiring has been poly-silicon or a poly-silicon/metal combination. However, poly-silicon has the disadvantage of a high resistance when compared to metals. Since timing and chip size become more and more critical for some application, poly-silicon or a poly-silicon/metal combination may not provide the necessary properties and characteristics to satisfy the specification requirements for these applications.

Especially high speed application of standard cells may provide problems by using poly-silicon or a poly-silicon metal combination as routing material. Standard cells, such as NANDs or NORs can be used in a wide variety of products and may or may not be in a critical timing path. As a result, it is desirable to design standard cells to operate very quickly.

The resistance R for an electrical path over a distance can be calculated as $$R = \frac{l \cdot \rho}{A}$$

wherein l is the length in meter, A is the cross sectional area in square meters and $\rho$ is the resistivity in $\Omega \cdot m$. In contrast, conductivity $\sigma$ is defined as the inverse product of the resistivity:

$$\sigma = \frac{1}{\rho}$$

Table 1 lists different resistivities for different conductive materials.

TABLE 1

| Material | Resistivity ($\Omega \cdot m$) at 20 C. |
|---|---|
| Copper | $1.72 \times 10^{-8}$ |
| Aluminum | $2.82 \times 10^{-8}$ |
| Tungsten | $5.6 \times 10^{-8}$ |
| Nickel | $6.99 \times 10^{-8}$ |
| Tin | $1.09 \times 10^{-7}$ |
| Silicon | $6.40 \times 10^{2}$ |

Therefore, using only a metal instead of a poly-silicon or a poly-silicon/metal combination for transistor level routing may be advisable for longer distances or for routing requirements where timing is critical. In addition, transistor level routing using only metals may be advisable for standard cells when it is not clear for what kind of application the standard cell is used. Transistor level routing using only metals may be especially advisable for standard cells used in high speed and low power applications.

One embodiment of the present invention provides a process flow to achieve transistor level routing using a metal only over a high-k dielectric. Another embodiment provides a process flow to achieve metal only/high-k dielectric routing for longer distances in an integrated circuit. Another embodiment further provides a gate stack and a metal only/high-k dielectric routing with substantially the same heights. Yet another embodiment provides a process flow to achieve metal only/high-k dielectric routing for a gate first process or a gate last process.

With reference now to FIG. 1, a cross sectional view of a workpiece, in particular a substrate 100 is shown. The substrate may be silicon or silicon on insulator (SOI). While silicon is the most prevalent type of substrate, other compound III-V or II-VI type substrates, Ge or SiGe may also be employed. FIG. 1 shows a substrate with trench isolation regions 150 and regions of active area 160.

A dielectric material layer 110 is deposited over the substrate 100. The dielectric material layer 110, preferably comprises a thickness of a view tens of A or less, and preferably comprises an insulating material such as a high-k dielectric material. The dielectric material layer 110 may alternatively comprise other insulating materials, such as an oxide, for example. In one embodiment the gate dielectric material 110 preferably comprises $HfO_2$, $Al_2O_3$, $TiO_2$, $HfSiO_x$, $ZrO_2$, or $ZrSiO_x$, for example. The dielectric material layer 110 may be deposited by atomic layer deposition (ALD), chemical vapor deposition (CVD), or metal oxide CVD (MOCVD). In one embodiment the dielectric material layer may be a multi-layer and may comprise a combination of the dielectric materials.

Optionally a thin material layer may be deposited over the dielectric material layer 110 (not shown). The material layer may comprise hybrid high-k materials or combinations of high-k materials and metal layers. Alternatively, the material layer may comprise conductive organic materials or combinations between conductive organic materials and hybrid-high-k materials.

Figure 2A:
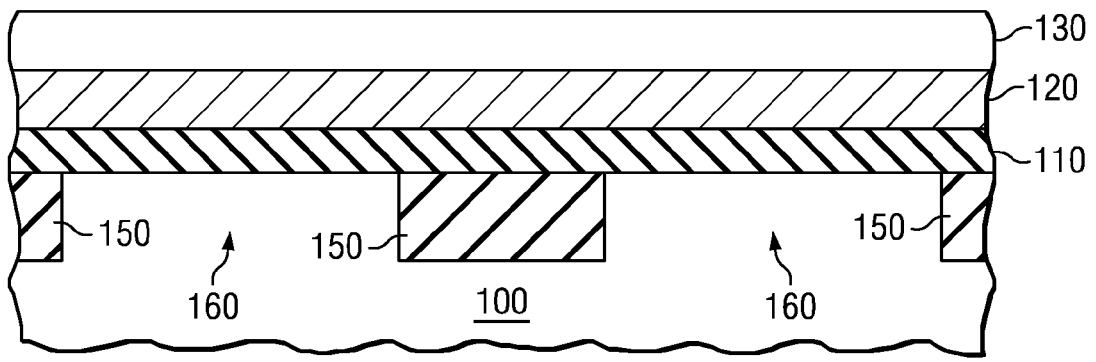
FIG. 2a shows a cross sectional view of layer arrangement on top of a substrate.
Figure 2B:
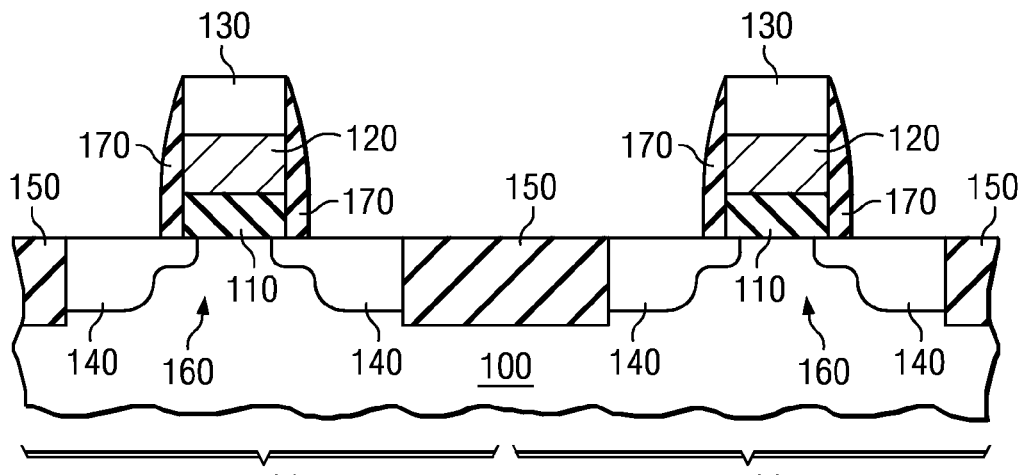
FIG. 2b shows a cross sectional view of a CMOS device.
Figure 2C:
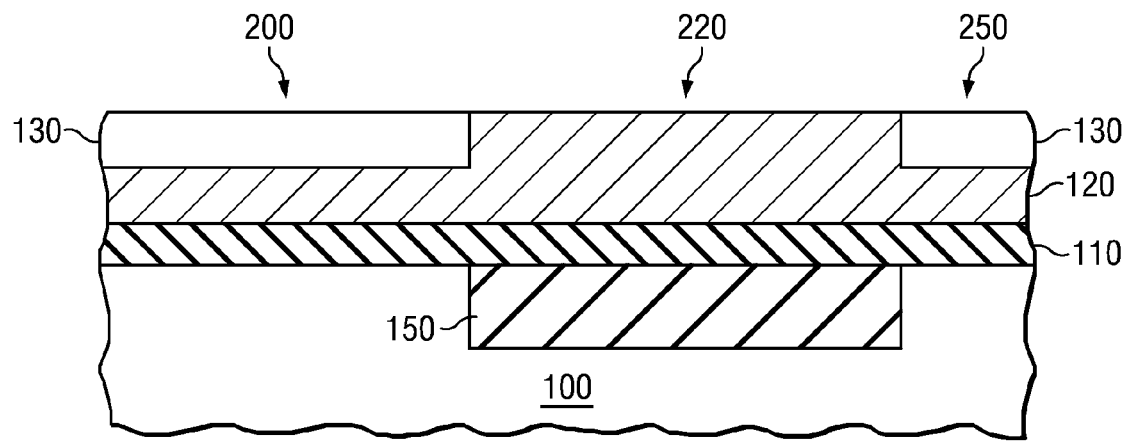
FIG. 2c shows a cross sectional view of an embodiment of a transistor level routing
Figure 5:
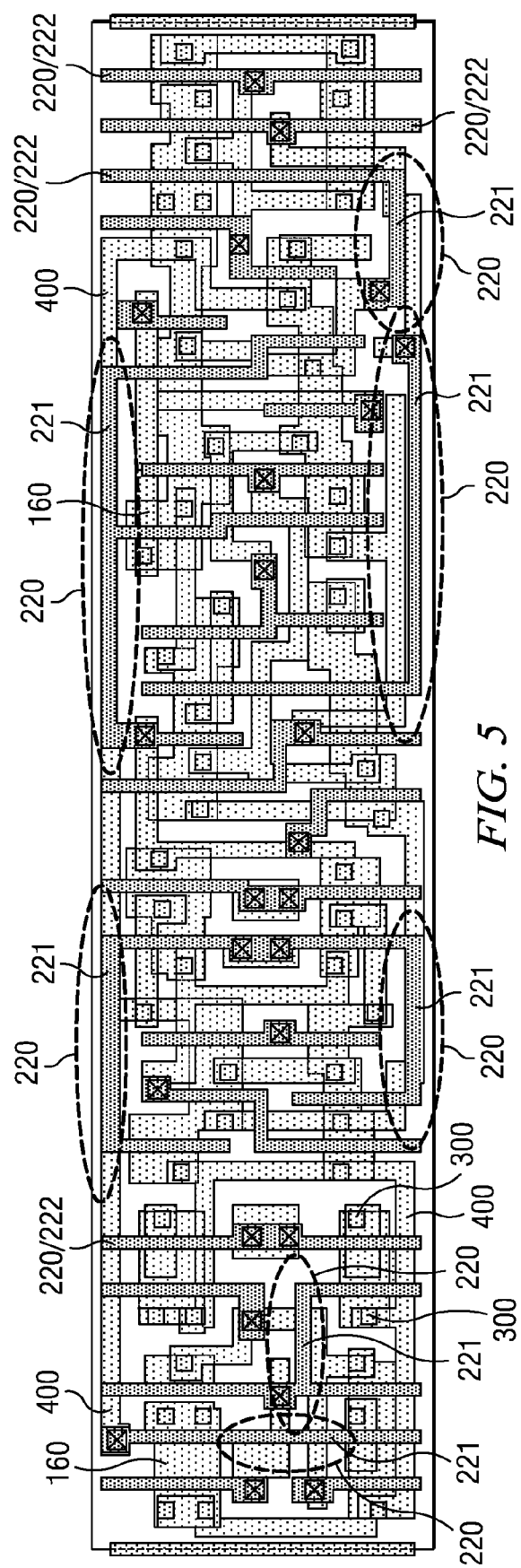
FIG. 5 shows a top view or a layout of an embodiment of a standard cell.

FIGS. 2a-2c show a first embodiment comprising a gate first process. Referring to FIG. 2a, a metal layer 120 is deposited over the gate dielectric 110. The metal layer 120 may be selectively formed over the substrate 100 and the dielectric 110. Alternatively, the metal layer 120 can be formed over the substrate 100 and the dielectric layer 110 and can be etched back using conventional lithography technology. The metal layer 120 maybe formed over the gate and over shorter distances but not over longer distances. For example, FIG. 5 shows a layout where some routing regions of the transistor level routing comprise semiconductive material routing and other regions of the transistor level routing comprise metal only routing. In this embodiment, after depositing the metal, a semiconductive material layer 130 may be selectively deposited on the gate and the areas of the combined semiconductive/metal routing but not in the areas of the metal only routing, for example. The same structure can be achieved by forming the semiconductive material layer 130 over the metal layer 120 and then selectively etching back the semiconductive material layer 130 in areas where metal only routing is desired. After the deposition of the semiconductive material layer 130, metal is disposed on the metal layer 120 where metal only routing is desired. Metal is preferably disposed up to the height of the semiconductive material layer 130.

The metal layer 120 preferably comprises Hf, Ta, Ti, Al, TiN, HfN, TaN, or combinations thereof. Alternatively, the metal layer 120 may comprise other metals. The metal layer 130 preferably comprises a thickness of about 100 A to 8000 A, as examples. Modern technologies may use a metal/high-k gate stack having a height of the metal between 70 nm to 120 nm. The metal layer 120 may be deposited by atomic layer deposition (ALD), chemical vapor deposition (CVD), metal oxide CVD (MOCVD), or any other appropriate deposition technique.

The semiconductive material layer 130 preferably comprises poly-silicon, although alternatively, the semiconductive material layer 130 may comprise amorphous silicon or other semiconductive materials, as examples. The semiconductive material layer 130 preferably comprises a thickness of about 100 A to 8000 A, as examples. In one embodiment the semiconductive material may comprise other dimensions, such as between about 1000 A and 2000 A. The semiconductive material layer 130 may be formed by CVD or physical vapor deposition (PVD), as examples, although alternatively, the semiconductive material layer may be deposited using other deposition techniques.

FIG. 2b shows a cross section view of a CMOS device from a first direction. The combined layers 110-130 are then patterned and etched, e.g., using lithography techniques, forming a high-k/metal/poly-silicon gate stack for a PMOS and a NMOS transistor. The source and drain regions 140 may be implanted with dopants and thermally annealed, and insulating spacers 170 may be formed next to the gate electrode and the gate dielectric of the PMOS and NMOS transistors, as shown.

FIG. 2c now shows a cross sectional view perpendicular to the cross sectional view of FIG. 2b. FIG. 2c shows a transistor level routing using the metal layer 120 electrically connecting two semiconductor devices 200 and 250. The first semiconductor device 200 may be a transistor, for example the PMOS or NMOS transistor with the high-k/metal/poly-silicon gate stack. The second semiconductor device 200 may also be a transistor having the same gate stack but, alternatively, may be any semiconductor device. As can be seen from FIG. 2c, the transistor level routing 220 between the first semiconductor device 200 and the second semiconductor device 250 comprises a metal layer over a high-k dielectric layer 110.

After finishing the gate stack and the transistor level routing, the front end of line (FEOL) process is finished by filling the gaps between the transistors with an isolating material and then forming the contacts. After the contacts are formed the first interconnect level or M1 is processed (BEOL).

Figure 3A:
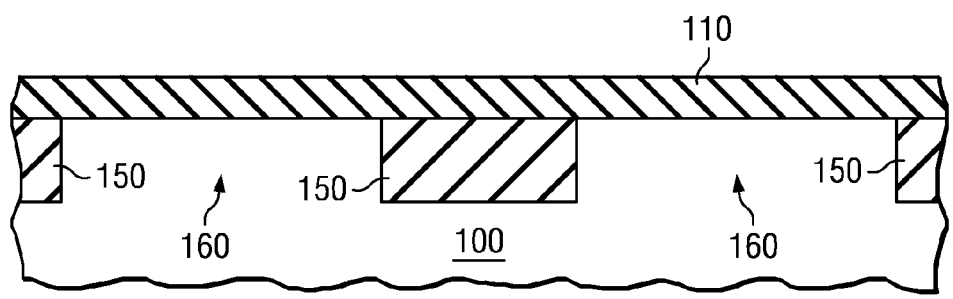
FIG. 3a shows a cross sectional view of layer arrangement on top of a substrate.
Figure 3B:
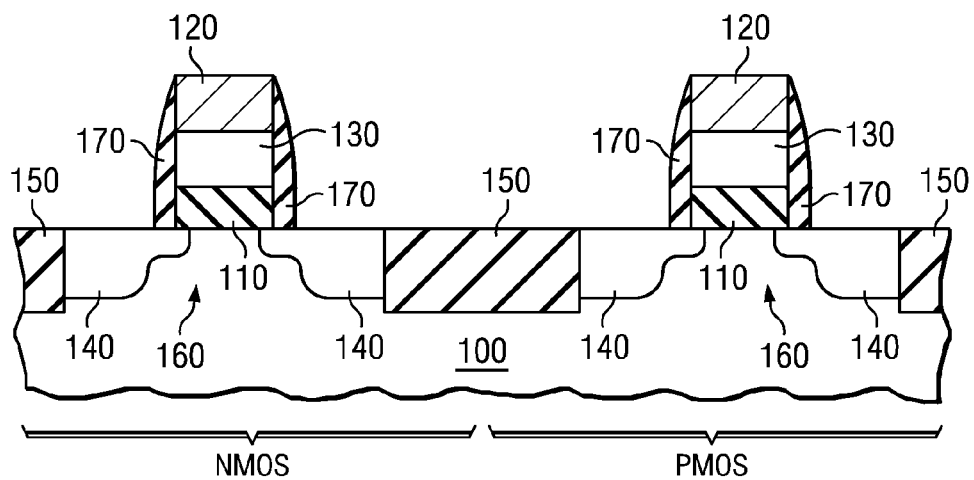
FIG. 3b shows a cross sectional view of a CMOS device.
Figure 3C:
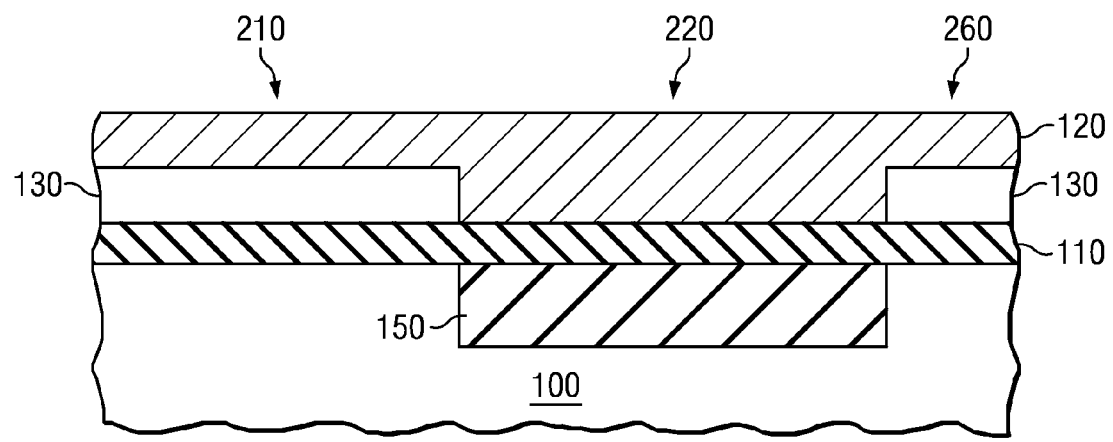
FIG. 3c shows a cross sectional view of an embodiment of a transistor level routing

FIGS. 3a-3c show a second embodiment comprising a gate last process. FIG. 3a is a cross sectional view of a work piece. The work piece comprises a substrate 100, wherein trench isolation regions 150 and active areas 160 are arranged. A dielectric layer 110 is formed on top of the substrate 100. A semiconductive material layer 130 is disposed on top of the dielectric layer 110. FIG. 3b shows a cross sectional view of a CMOS device formed using similar process steps as in FIG. 2b. The gate stack of the CMOS transistors, i.e., a PMOS and a NMOS, however, includes a dielectric layer 110, semiconductive material layer 130 and metal layer 120 stack wherein the metal gate is arranged above the semiconductive material layer 130 making it a gate last process.

FIG. 3c shows an orthogonal cross sectional view to that of FIG. 3b. As can be seen from FIG. 3c the metal only routing 220 electrically connects semiconductor devices 210, which may be a PMOS or a NMOS transistors for example, with semiconductor device 260. As can be seen from FIG. 3c the metal/high-k routing 220 is similar to that of FIG. 2c. The semiconductive material layer 130 maybe selectively disposed where the semiconductor devices 210, 260 will be formed. Alternatively, the semiconductive material layer 130 maybe formed where the transistor level routing will take place but will be etched back, using conventional lithography techniques, in regions where metal only transistor level routing is desired. A metal layer 120 is disposed on top of the semiconductive material layer 130 in the regions where semiconductor devices will be formed and in regions where a combined poly-silicon/metal layer will be used for transistor level routing. In other regions, the metal layer 120 will be directly disposed on the dielectric layer 110. The materials and deposition techniques for the dielectric layer 110, the semiconductive material layer 130 and the metal layer 120 are the same as described earlier.

After finishing the gate stack and the transistor level routing, the front end of line (FEOL) process is finished by filling the gaps between the transistors with an isolating material and then forming the contacts. In one embodiment, the conventional standard CMOS to finish the FEOL process may be used.

In one embodiment, the transistor level routing may electrically connect semiconductor device 200 with semiconductor device 260 or semiconductor device 210 with semiconductor device 250. The transistor level routing 220 is carried out by a metal/high-k dielectric layer stack.

In another embodiment, only a metal layer 120 is deposited over the dielectric layer 110 to form a semiconductor device such as a transistor and the transistor level routing. No semiconductive material layer 130 is formed either over the metal layer 120 and/or the dielectric layer 110. No semiconductive material layer 130 is used for the gate stack and/or short or long distances transistor level routing.

In yet another embodiment, the transistor level routing material stack has the same height than the stack of the semiconductor devices, in particular, the gate stack of the transistors.

Figure 4:
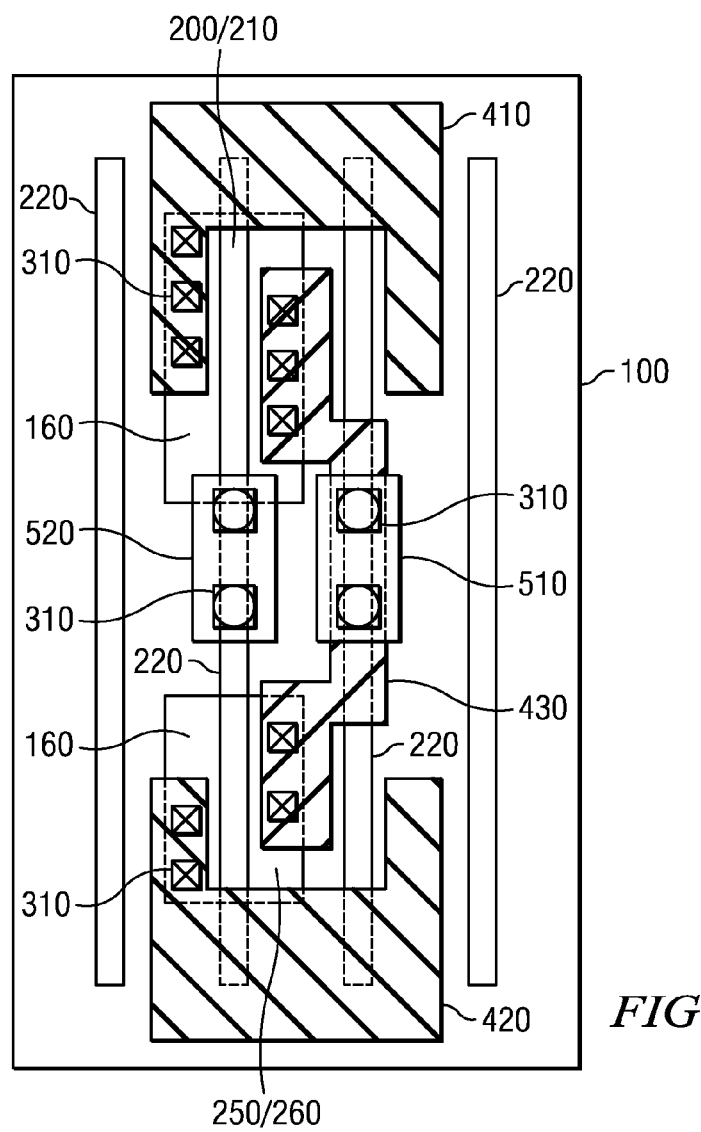
FIG. 4 shows a top view or a layout of an embodiment of a simple semiconductor device and its transistor level routing.

Referring now to FIG. 4, a top view or a layout of an embodiment of a simple semiconductor device and its metal only/high-k routing is shown. The embodiment may be an inverter, for example. Active areas 160 are arranged in a substrate 100. Metal routing lines 220 are arranged directly over a high-k dielectric layer (not shown) and the active areas 160/substrate 100. The metal/high-k routing lines 220 electrically connect a first transistor 200/210 and a second transistor 250/260. Contacts 310 are arranged to connect the first transistor 200/210 and the second transistor 250/260 to the first interconnect layer or M1. Interconnect layer M1 is illustrated by several pieces of interconnects 410-430. An insulator is arranged between the substrate 100 active area 160, the metal/high-k routing lines 220 and the interconnect pieces 410-430 of the M1 interconnect layer (not shown). Interconnect 410 is used as $V_{dd}$ (power in M1) and interconnect 420 is used as $V_{ss}$ (Ground in M1) while interconnect 430 is used to connect the two transistors at the M1 interconnect level. An inverter gate (entrance) 520 and a drain (exit) 510 are arranged on top of the M1 interconnect level. The inverter gate 520 is connected to the metal only/high-k routing lines 220 via vias 310 while the inverter drain 510 is connected to the metal interconnect 430 on the M1 interconnect level via vias 310.

FIG. 5 shows a top view or a layout of an embodiment of a standard cell. FIG. 5 shows active areas 160, vias 300, metal routing lines 220 and M1 interconnect layer 400. The standard cell uses metal only/high-k dielectric routing 221 for transistor level routing 220 in some regions of the cell while it uses semiconductive/metal routing 222 for transistor level routing 220 in other regions. FIG. 5 shows clearly that metal only/high-k dielectric routing 221 is preferably used to connect semiconductor devices spaced apart by longer distances while semiconductive/metal 222 routing is preferably used to connect semiconductor devices spaced apart by shorter distances. However, as mentioned above, the standard cell may only include metal only/high-k dielectric to interconnect its semiconductor devices on a transistor level routing basis. Metal only/high-k dielectric routing may be used for distances of 1-100 micrometers and up to one millimeter, for example.

Although the embodiments of the present invention and their advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor device, the method comprising:
   forming a high-k dielectric layer over a substrate;
   forming a metal layer directly over the high-k dielectric layer;
   selectively disposing a semiconductive layer over the metal layer;
   forming a first transistor in a first region and a second transistor in a second region spaced from the first region, the first and second transistor having gate stacks comprising a high-k dielectric layer, a metal layer and a semiconductive layer; and
   forming an electrical connection between the first transistor and the second transistor comprising the high-k dielectric layer and the metal layer but not the semiconductive layer.

2. The method according to claim 1, further comprising:
   forming a thin material layer over the high-k dielectric layer, the metal layer and the semiconductive layer being formed on the thin material layer.

3. The method according to claim 1, wherein the semiconductive layer comprises a poly-silicon layer.

4. The method according to claim 1, further comprising:
   forming a third transistor in a third region, the third region being spaced apart from the first region and the second region; and
   forming an electrical connection between the first transistor and the third transistor comprising the high-k dielectric layer, the semiconductive layer and the metal layer.

5. The method according to claim 2, wherein forming the electrical connection between the first transistor and the second transistor comprises forming the electrical connection for a first distance above 1 μm.

6. The method according to claim 2, wherein forming the electrical connection between the first transistor and the third transistor comprises forming the electrical connection for a second distance below 1 μm.

7. A method comprising:
   forming a first semiconductor device in a first active area of a substrate, the first semiconductor device having a first gate stack comprising a first high-k dielectric layer, a first metal layer and a first semiconductive layer;
   forming a second semiconductor device in a second active area of the substrate, the second semiconductor device having a second gate stack comprising a second high-k dielectric layer, a second metal layer and a second semiconductive layer; and
   forming an electrical connection connecting the first semiconductor device with the second semiconductor device and overlying the first active area, the second active area and a portion of the substrate between the first active area and the second active area, wherein the electrical connection comprises a third high-k dielectric layer and a third metal layer but not a semiconductive layer, and wherein the third metal layer is arranged directly over the third high-k dielectric layer.

8. The method according to claim 7, wherein the first metal layer, the second metal layer and the third metal layer comprise a same material.

9. The method according to claim 7, wherein the first high-k dielectric, the second high-k dielectric and the third high-k dielectric comprise a same material.

10. The method according to claim 7, wherein the first semiconductive layer and the second semiconductive layer comprise poly-silicon.

11. The method according to claim 7, wherein the first metal layer is disposed beneath the first semiconductive layer, and wherein the second metal layer is disposed beneath the second semiconductive layer.

12. The method according to claim 7, wherein the first metal layer is disposed above the first semiconductive layer, and wherein the second metal layer is disposed above the second semiconductive layer.

13. The method according to claim 7, further comprising forming a thin material layer between the first high-k dielectric and the first metal layer.

14. A method comprising:
   forming a first semiconductor device located in a first region of a substrate;
   forming a second semiconductor device locate in a second region of the substrate;
   forming a third semiconductor device located in a third region of the substrate;
   connecting the first semiconductor device and the second semiconductor device with a first electrical connection; and
   connecting the first semiconductor device and the third semiconductor device with a second electrical connection, wherein the first electrical connection comprises a metal but not a semiconductive material, wherein the second electrical connection comprises a semiconductive material, and wherein the first electrical connection and the second electrical connection are disposed directly over a high-k dielectric layer.

15. The method according to claim 14, wherein the semiconductive material comprises poly-silicon.

16. The method according to claim 14, wherein the first semiconductive device comprises a gate stack and wherein the gate stack comprises the high-k dielectric layer, the semiconductive material and the metal.

17. The method according to claim 16, wherein the semiconductive material is arranged above the high-k dielectric layer, and wherein the metal is arranged above the semiconductive material.

18. The method according to claim 16, wherein the metal is arranged above the high-k dielectric layer, and wherein the semiconductive material is arranged above the metal.

19. The method according to claim 14, wherein the first semiconductor device, the second semiconductor device, and the third semiconductor device comprise a same gate stack.

20. The method according to claim 14, wherein a thin material layer is arranged between the high-k dielectric layer and the semiconductive material or the metal.

* * * * *